(12) United States Patent
Nakamura

(10) Patent No.: US 6,349,066 B1
(45) Date of Patent: Feb. 19, 2002

(54) SEMICONDUCTOR STORAGE DEVICE HAVING A SELF-REFRESH CIRCUIT FOR AUTOMATICALLY REFRESHING MEMORY CELL

(75) Inventor: Yayoi Nakamura, Tokyo (JP)

(73) Assignee: Mitsubishi Denki Kabuhsiki Kaisha, Tokyo (JP)

( * ) Notice: Subject to any disclaimer, the term of this patent is extended or adjusted under 35 U.S.C. 154(b) by 0 days.

(21) Appl. No.: 09/697,155

(22) Filed: Oct. 27, 2000

(30) Foreign Application Priority Data

Jan. 17, 2000 (JP) .......................... 12-007912

(51) Int. Cl.$^7$ ............................................... G11C 7/00
(52) U.S. Cl. .................. 365/201; 365/222; 365/189.07
(58) Field of Search ................................ 365/201, 222, 365/189.07

(56) References Cited

U.S. PATENT DOCUMENTS

| 4,771,406 A | * | 9/1988 | Oishi et al. ................. 365/222 |
| 5,157,634 A | * | 10/1992 | Dhong et al. ............... 365/222 |
| 5,270,982 A | * | 12/1993 | Watanabe ................... 365/222 |
| 5,625,597 A | * | 4/1997 | Hirose ......................... 365/201 |
| 5,862,094 A | * | 1/1999 | Kawabata et al. .......... 365/222 |
| 5,959,925 A | * | 9/1999 | Tatsumi ....................... 365/222 |
| 5,999,457 A | * | 12/1999 | Sato ....................... 365/189.01 |
| 6,141,280 A | * | 10/2000 | Cho ............................. 365/222 |

FOREIGN PATENT DOCUMENTS

JP    6-236682    8/1994

* cited by examiner

Primary Examiner—Vu A. Le
Assistant Examiner—Tuan T. Nguyen
(74) Attorney, Agent, or Firm—McDermott, Will & Emery

(57) ABSTRACT

An output circuit (6) of a DRAM (semiconductor storage device) is provided with a refresh monitor circuit which is substantially composed of a NAND gate (NA1), an AND gate (A1), Pch-Tr2 and Nch-Tr4. The TMSELF signal (test mode signal) and the int. ZRAS signal (internal signal for provoking a refreshing action) are inputted into the refresh monitor circuit. The refresh monitor circuit outputs a monitoring signal, which has a wave form as same as that of the int. ZRAS signal, to an output node (DQ) of the output circuit (6), when the TMSELF signal has become H during the self refresh process. The refresh monitor circuit can monitor the int. ZRAS signal on the basis of the monitoring signal.

18 Claims, 6 Drawing Sheets

SEMICONDUCTOR STORAGE DEVICE HAVING A SELF-REFRESH CIRCUIT FOR AUTOMATICALLY REFRESHING MEMORY CELL

BACKGROUND OF THE INVENTION

1. Field of the Invention

The present invention relates to a semiconductor storage device such as a DRAM etc. having a refresh circuit, particularly to the semiconductor storage device having a self refresh circuit for automatically refreshing memory cells while automatically counting up an internal address counter.

2. Description of the Prior Art

A DRAM (Dynamic Random Access Memory), which is one of semiconductor storage devices, is widely used as a storage device of each of various electronic apparatuses such as a personal computer and so on, because each of memory cells of the DRAM has a smaller occupying area so that the DRAM can be highly integrated. In the DRAM, however, the electric charge stored in each of the memory cells decreases with lapse of time. If the DRAM is merely left after data has been stored in the memory cell, the stored data is to disappear after all.

In the DRAM, therefore, in order to prevent the disappearance of the stored data, refresh (rewrite), which is such an action as to re-inject the electrical charge into the memory cell, is suitably performed. As the above-mentioned refresh, there has been widely used self refresh, in which a signal for requesting the refresh is generated within the DRAM while the memory cells are automatically refreshed in turn using the address activated by an internal address counter. Hereinafter, there will be described an example of a method of performing self refresh for an ordinary DRAM. FIG. 9 is a block diagram showing a self refresh circuit and other circuits relating thereto in a conventional DRAM. FIG. 10 is a timing chart showing the changes of signals with lapse of time during the self refresh process of the DRAM.

As shown in FIG. 9, the DRAM is provided with a self refresh circuit which is substantially composed of a self-in timer 1, a self refresh timer 2 and an internal address counter 3, a raw system control circuit 4, and memory cells 5 (memory array).

In FIG. 9 or 10, the ext. ZRAS signal is a raw address strobe signal while the ext. ZCAS signal is a column address strobe signal, the both signals being external input signals. On the other hand, the ZCBR signal, the ZSELFS signal, the ZREFS signal, the int. ZRAS signal, the REFA signal and the Q signal are internal signals. Among the above-mentioned signals, the signal which includes the letter "Z" in its symbol, is L-active (low-active). The ZCBR signal becomes L (low-level), when the ext. ZRAS signal has become L after the ext. ZCAS signal became L.

The self-in timer 1 is such a circuit as to cause the ZSELFS signal to become L when the constant time tO has passed after the self-in timer 1 received the ZCBR signal, the ZSELFS signal being outputted to the output node (ZSELFS node). The self refresh timer 2 which is connected to the self-in timer 1 through the ZSELFS node, is such a circuit as to cause the int. ZKAS signal to become L at constant periodical time after receiving the L of the ZSELFS signal, and to cause the REFA signal to generate H (high-level) pulses. The internal address counter 3 is such a circuit as to count up the Q signal while receiving H pulses of the REFA signal outputted from the self refresh timer 2, so as to output it to the output node (Q node).

The Q signal is an internal address signal having a plurality of bits, namely a signal for designating the address of each of the memory cells 5 (memory array) to be self-refreshed. The raw system control circuit 4 is such a circuit as to activate (refresh) and control each of the memory cells 5 connected to the raw system control circuit 4 while receiving the int. ZRAS signal outputted from the self refresh timer 2 and the Q signal outputted from the internal address counter 3.

Hereinafter, the action of the self refresh circuit shown in FIG. 9 will be described using the timing chart shown in FIG. 10. At first, both of the ext. ZRAS and ext. ZCAS signals are H (high-level). Next, when the ext. ZRAS signal has become L after the ext. ZCAS signal became L (low-level), the ZCBR signal becomes L. The self-in timer 1 receives the L of the ZCBR signal so as to be activated. If both of the ext. ZRAS and ext. ZCAS signals hold the L states for the constant time tO after the activation (falling) of the ZCBR signal, the ZSELFS signal becomes L so that the self refresh starts.

The ZSELFS signal activates the self refresh timer 2 so as to cause the ZREFS signal to become L at the constant periodical time tB. Following that, the int. ZRAS signal becomes L. Then the H pulse is generated in the REFA signal when the int. ZRAS signal becomes L, so that the internal address counter 3 receives the pulse so as to be activated. In consequence, the Q signal (internal address) counts up one by one. The raw system control circuit 4 receives the int. ZRAS signal outputted from the self refresh timer 2 and the Q signal (internal address) outputted from the internal address counter 3 so as to be activated, so that the memory cell 5 (memory array) is refreshed. When the constant time tA has passed after the int. ZRAS signal became L, the ZREFS signal becomes H so that the int. ZRAS signal also becomes H in accordance with the H of the ZREFS signal.

As described above, during the period that the ZSELFS signal is being L, the above-mentioned actions that the ZREFS signal and the int. ZRAS signal change from H to L or from L to H are repeated so that the DRAM is automatically refreshed.

By the way, the DRAM is subjected to various tests for testing whether the self refresh will be correctly performed as previously designed or not, or the like. When the above-mentioned tests are performed, it may be the best to detect the internal signal for provoking the refresh, namely the wave form of the int. ZRAS signal so as to monitor the wave form. In the conventional circuit construction of the DRAM, however, it is impossible to detect the wave form of the int. ZRAS signal generated within the DRAM. In short, in the conventional DRAM, there exists such a problem that the int. ZRAS signal for provoking the refresh can not be monitored.

In the Japanese Laid-open Patent Publication No. 6-236682, there is disclosed a storage device (DRAM) in which a signal from which the periodical time of refresh can be detected, is outputted from an I/O pin by applying a test signal ϕ TEST to a section for generating a signal to un-activate a CAS system or by applying the test signal ϕ TEST to an output circuit, during the test mode process. In the conventional storage device, however, the wave form of the ant. ZRAS signal for provoking the refresh can not be monitored.

In the Japanese Laid-open Patent Publication No. 2-105389, there is further disclosed a dynamic type of storage device (DRAM) in which the number of refresh is counted by an internal address counter during the self refresh process so that the average value of the periodical time of the refresh is calculated on the basis of the number of the refresh and the time required for performing the self refresh. In the conventional dynamic type of storage device, however, the wave form of the int. ZRAS signal for provoking the refresh can not be also monitored.

SUMMARY OF THE INVENTION

The present invention is achieved to solve the above-mentioned problems, and has an object to provide a semiconductor storage device which can detect the wave form of the internal signal for provoking the refresh so as to monitor the wave form.

According to the present invention which has been developed to achieve the above-mentioned object, there is provided a semiconductor storage device (e.g. DRAM) in which each of memory cells (or memory array) is subjected to self refresh on the basis of a specific internal signal (e.g. int. ZRAS signal) for provoking a refreshing action (i.e. rewriting action), which includes a refresh monitor circuit appended to an output circuit. The refresh monitor circuit receives a test mode signal of H (high-level) or L (low-level) and then outputs a monitoring signal into a data output pin (or data output node) when the test mode signal is H during the self refresh process. Hereupon, the monitoring signal has a wave form as same as that of the specific internal signal.

In the semiconductor storage device, if the test mode signal applied to the refresh monitor circuit is set to H during the self refresh process, the monitoring signal having the wave form as same as that of the internal signal for provoking the refresh is outputted to the data output pin. Therefore, by setting the test mode signal to H during the self refresh process, the wave form of the internal signal for provoking the refresh can be detected at any time so that it can be monitored. In consequence, various tests relating to the self refresh, such as a test for testing whether the semiconductor storage device has a self-refreshing function as previously designed or not, can be performed easily and correctly.

In the above-mentioned semiconductor storage device, the output circuit may include a P-channel field effect transistor into which a first data signal is inputted through a gate thereof and an N-channel field effect transistor into which a second data signal is inputted, through a gate thereof, the output circuit having such a circuit construction that drains of the both field effect transistors are connected to each other, and further a source of the P-channel field effect transistor is connected to a higher voltage section (e.g. power source) while a source of the N-channel field effect transistor is connected to a lower voltage section (e.g. ground). Hereupon, the refresh monitor circuit may include a P-channel field effect transistor for monitoring use and an N-channel field effect transistor for monitoring use, the P and N channel effect transistors for monitoring use being connected to the P-channel field effect transistor and the N-channel field effect transistor in parallel, respectively. The semiconductor storage device may further include a logic circuit which receives the test mode signal and the specific internal signal, and then causes each of the field effect transistors for monitoring use to output an output signal to the data output pin when the test mode signal is H during the self refresh process while causing each of the field effect transistors for monitoring use to become a high impedance state when the test mode signal is L, the output signal having a wave form as same as that of the specific internal signal.

In this case, although the semiconductor storage device has such a simple construction that the P-channel field effect transistor for monitoring use, the N-channel field effect transistor for monitoring use and the logic circuit are merely appended to the output circuit, the wave form of the internal signal for provoking the refreshing action can be detected and monitored at any time by setting the test mode signal to H during the self refresh process. In consequence, the cost for manufacturing the semiconductor storage device may be lowered because the construction of the refresh monitor circuit becomes simple.

The above-mentioned semiconductor storage device may include a test mode signal generating circuit for generating the test mode signal of H or L on the basis of an external input signal, the test mode signal being inputted into the refresh monitor circuit.

In this case, the test mode signal inputted into the refresh monitor circuit may be easily changed to H or, L by applying a predetermined external input signal to the test mode signal generating circuit. In consequence, various tests relating to the self refresh may be more easily performed.

In the above-mentioned semiconductor storage device, the test mode signal generating circuit may cause the test mode signal to become H, when an L-active external raw address strobe signal (ext. ZRAS signal) has become L later in comparison with an L-active external column address strobe signal (ext. ZCAS signal) and an L-active external write enable signal (ext. ZWE signal).

In this case, it may be surely prevented that the test mode signal becomes H when the refresh can not be performed (ext. ZWE signal being H) because the test mode signal becomes H after the ext. ZWE signal has become L. In consequence, the accuracy of each of the various tests relating to the self refresh may be improved.

In the above-mentioned semiconductor storage device, the self refresh may be performed when a predetermined time has passed after the ext. ZRAS signal became L later in comparison with the ext. ZCAS signal.

In this case, the refresh may start after the semiconductor storage device has surely become such a state that the self refresh can be performed, because the self refresh is performed when the predetermined time has passed after the ext. ZRAS signal became L. In consequence, the reliability of the semiconductor storage device may be improved.

In the above-mentioned semiconductor storage device, the self refresh may be performed when the ext. ZRAS signal has become L later in comparison with the ext. ZCAS signal.

In this case, the time required for performing the self refresh may be shortened, because the self refresh is performed when the ext. ZRAS signal has become L. In addition, the number of the timers may be reduced by one in comparison with the case of the semiconductor storage device described above. In consequence, the functional performance of the semiconductor storage device may be improved.

BRIEF DESCRIPTION OF THE DRAWINGS

The present invention will become more fully understood from the detailed description given below and the accompanying drawings, wherein.

DETAILED DESCRIPTION OF THE PREFERRED EMBODIMENTS (First Embodiment)

Hereinafter, the first embodiment of the present invention will be concretely described.

Figure 1:
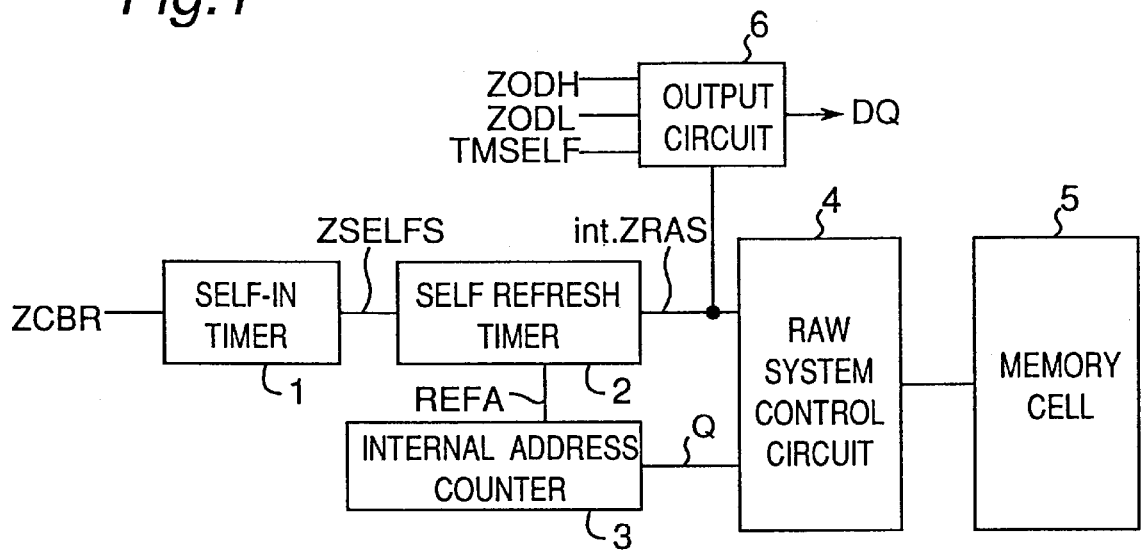
FIG. 1 is a block diagram showing a self refresh circuit of a DRAM according to the first embodiment of the present invention and other circuits relating thereto.
Figure 9:
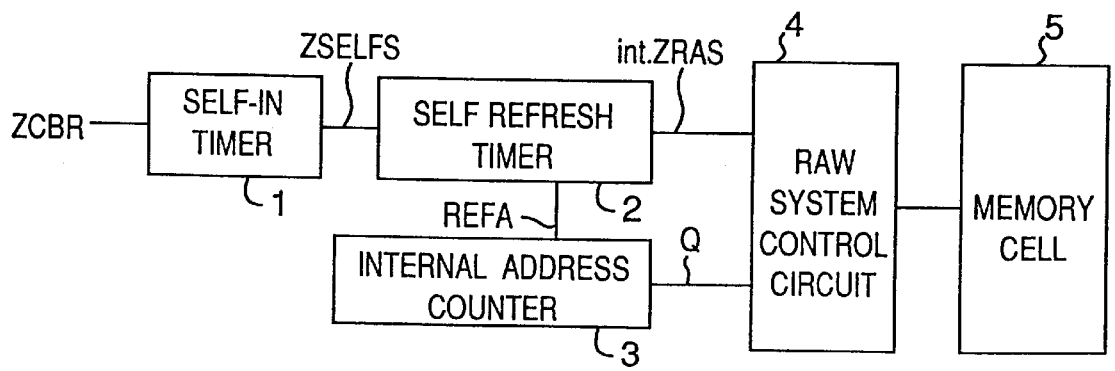
FIG. 9 is a block diagram showing a self refresh circuit of a conventional DRAM and other circuits relating thereto.
Figure 10:
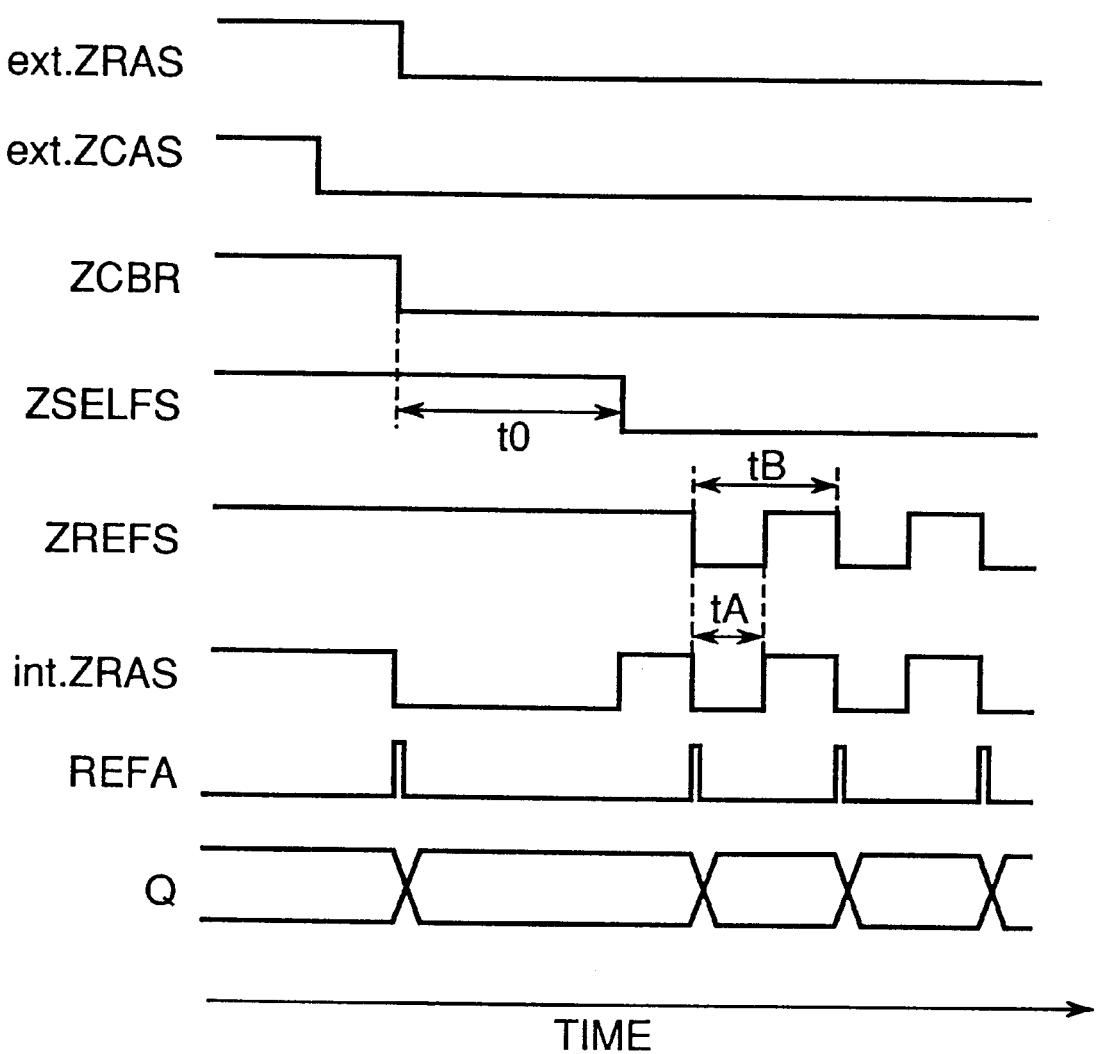
FIG. 10 is a timing chart showing changes of various signals with lapse of time during the self refresh process of the conventional DRAM shown in FIG. 9.

FIG. 1 (block diagram) shows a self refresh circuit of a DRAM according to the first embodiment and other circuits relating thereto. In the DRAM shown in FIG. 1, however, constructive members which are common with those of the conventional DRAM shown in FIG. 9, are designated as the same reference numbers as those in FIG. 9, and the detailed descriptions about those members are omitted in order to avoid duplicate descriptions.

As shown in FIG. 1, in the DRAM according to the first embodiment, the int. ZRAS signal outputted from a self refresh timer 2 to a raw system control circuit 4 and the TMSELF signal, as well as the ZODH and ZODL signals (data signals) corresponding to the data which has been read out from memory cells 5 (or memory array), are inputted into an output circuit 6. On the other hand, the output signal (DQ signal) of the output circuit 6 is outputted to an output node DQ (DQ pin). The TMSELF signal, the ZODH signal and the ZODL signal are all internal signals. The TMSELF signal is a test mode signal for outputting the monitoring signal having a wave form as same as that of the int. ZRAS signal or the int. ZRAS signal itself to the output node DQ during the self refresh process.

Figure 2:
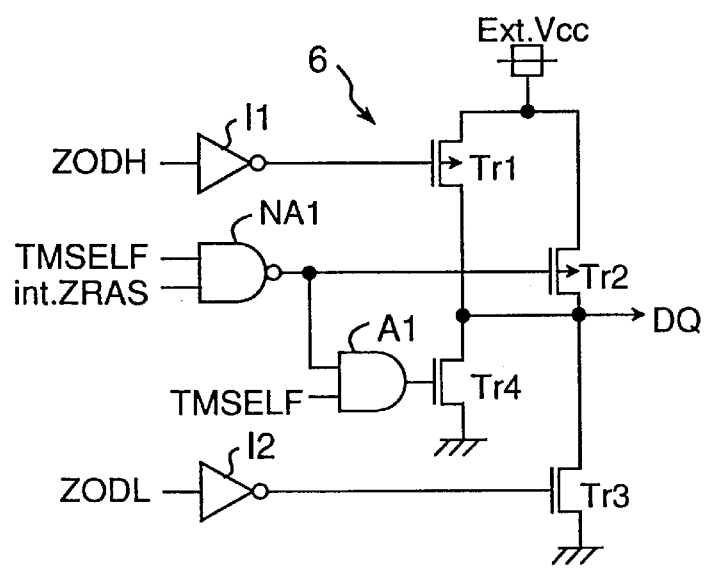
FIG. 2 is a circuit diagram showing the construction of an output circuit of the DRAM shown in FIG. 1.

As shown in FIG. 2, the output circuit 6 is substantially composed of inverters I1 and I2 (NOT gate), a NAND gate NA1, an AND gate A1, P-channel MOS transistors Tr1 and Tr2 (hereinafter, referred to "Pch-Tr1" or "Pch-Tr2") and N-channel MOS transistors Tr3 and Tr4 (hereinafter, referred to "Nch-Tr3" or "Nch-Tr4"). The output terminal of the inverter I1 is connected to the gate of the Pch-Tr1 while the output terminal of the inverter I2 is connected to the gate of the Nch-Tr3. The output circuit 6 has such a circuit construction that the drain of the Pch-Tr1 is connected to the drain of the Nch-Tr3. On the contrary, the output circuit of the conventional DRAM is not provided with the refresh monitor circuit composed of the NAND gate NA1, the AND gate A1, the Pch-Tr2 and the Nch-Tr4.

That is, the output circuit 6 shown in FIG. 2 is such a circuit that the Pch-Tr2 and the Nch-Tr4 are connected in parallel to the Pch-Tr1 and the Nch-Tr3, which are also provided on the conventional output circuit, respectively. The output signal of the NAND gate NA1 into which the TMSELF signal and the int. ZRAS signal are inputted, is inputted into the gate of the Pch-Tr2. On the other hand, the output signal of the AND gate A1 into which the output signal of the NAND gate NA1 and the TMSELF signal are inputted, is inputted into the gate of the Nch-Tr4.

When the self refresh is not being performed in the output circuit 6, namely the int. ZRAS signal is H at all times, the TMSELF signal is set to L. Because the TMSELF signal is L while the int. ZRAS signal is H at that time, the output signal of the NAND gate NA1 becomes H. The Pch-Tr2 becomes OFF because the H signal is inputted into the gate of the Pch-Tr2. On the other hand, the output signal of the AND gate A1 becomes L because the output signal of the NAND gate NA1 is H while the TMSELF signal is L. The Nch-Tr4 becomes OFF because the L signal is inputted into the gate of the Nch-Tr4. In consequence, the output circuit 6 becomes such a state substantially as same as that of the above-mentioned output circuit of the conventional DRAM so that it functions as the ordinary output circuit so as to output the data signal to the output node DQ.

On the other hand, when the self refresh is being performed in the output circuit 6, the int. ZRAS signal periodically becomes H or L so that the memory cell 5 having the address designated by the internal address counter 3 is refreshed at every time that the int. ZRAS signal becomes L. If the TMSELF signal is H at that time, the monitoring signal having the wave form as same as that of the int. ZRAS signal or the int. ZRAS signal itself is outputted to the output node DQ (DQ pin). If the TMSELF signal is L on the contrary, the output circuit 6 becomes such a state substantially as same as that of the above-mentioned output circuit of the conventional DRAM (high impedance state).

Hereinafter, the above-mentioned action of the output circuit 6 during the self refresh process will be more minutely described. The Pch-Tr1 and the Nch-Tr3 are OFF together during the self refresh process.

At first, there will be described such a case that the TMSELF signal is H. In this case, the output signal of the NAND gate NA1 becomes L if the int. ZRAS signal is H. The L signal is inputted into the gate of the Pch-Tr2 so that the Pch-Tr2 becomes ON. On the other hand, the output signal of the AND gate A1 becomes L because the output signal of the NAND gate NA1 is L while the TMSELF signal is H. The L signal is inputted into the gate of the Nch-Tr4 so that the Nch-Tr4 becomes OFF. In consequence, the potential of the power source Ext. Vcc, namely the H signal, is outputted to the output node DQ through the Pch-Tr2.

On the other hand, the output signal of the NAND gate NA1 becomes H if the int. ZRAS signal is L. The H signal is inputted into the gate of the Pch-Tr2 so that the Pch-Tr2 becomes OFF. Meanwhile, the output signal of the AND gate A1 becomes H, because the output signal of the NAND gate NA1 is H, and further the TMSELF signal is also H. The H signal is inputted into the gate of the Nch-Tr4 so that the Nch-Tr4 becomes ON. In consequence, the ground potential, namely the L signal, is outputted to the output node DQ through the Nch-Tr4.

In short, when the TMSELF signal is H during the self refresh process, the H signal is outputted to the output node DQ if the int. ZRAS signal is H while the L signal is outputted to the output node DQ if the int. ZRAS signal is L. That is, the monitoring signal having the wave form as same as that of the int. ZRAS signal or the int. ZRAS signal itself is outputted to the output node DQ.

Next, there will be described such a case that the TMSELF signal is L. In this case, the output signal of the NAND gate NA1 becomes H if the int. ZRAS signal is H. The H signal is inputted into the gate of the Pch-Tr2 so that the Pch-Tr2 becomes OFF. On the other hand, the output signal of the AND gate A1 becomes L because the output signal of the NAND gate NA1 is H while the TMSELF signal is L. The L signal is inputted into the gate of the Nch-Tr4 so that the Nch-Tr4 becomes OFF. In consequence, the output circuit 6 becomes such a state substantially as same as that of the above-mentioned output circuit of the conventional DRAM.

On the contrary, the output signal of the NAND gate NA1 becomes H if the int. ZRAS signal is L. The H signal is inputted into the gate of the Pch-Tr2 so that the Pch-Tr2 becomes OFF. On the other hand, the output signal of the AND gate A1 becomes L because the output signal of the NAND gate NA1 is H while the TMSELF signal is L. The L signal is inputted into the gate of the Nch-Tr4 so that the Nch-Tr4 becomes OFF. In this case, therefore, the output circuit 6 also becomes such a state substantially as same as that of the above-mentioned output circuit of the conventional DRAM.

In consequence, when the TMSELF signal is L during the self refresh process, the output circuit 6 becomes a high impedance state so that the wave form of the int. ZRAS signal is not outputted to the output node DQ.

Hereinafter, the concrete construction and function of the test mode signal generating circuit for generating the TMSELF signal (test mode signal), which is applied to the output circuit 6, will be described.

Figure 3:
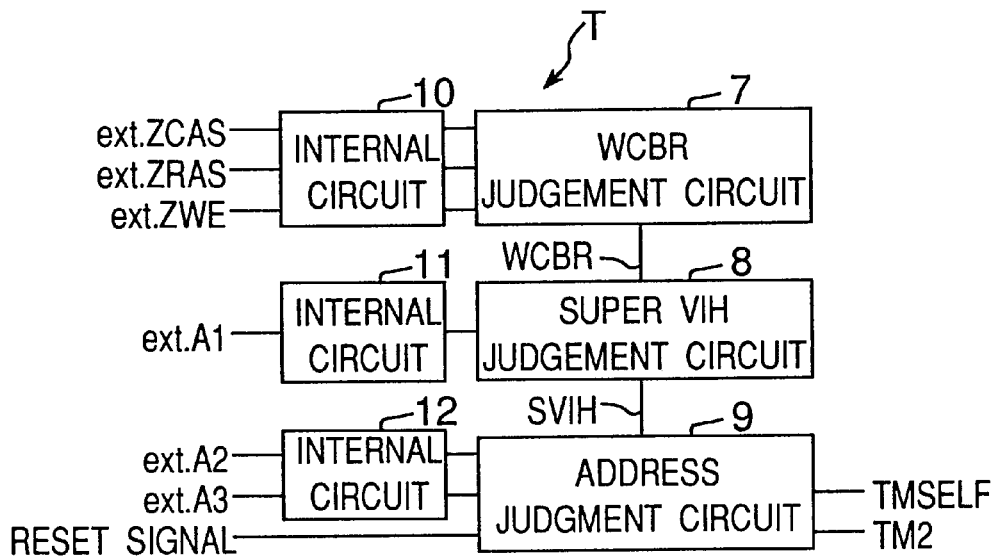
FIG. 3 is a block diagram showing the construction of a test mode signal generating circuit for applying a TMSELF signal to the output circuit shown in FIG. 2.

FIG. 3 is a block diagram showing an example of the above-mentioned test mode signal generating circuit. As shown in FIG. 3, the test mode signal generating circuit T (test mode setting circuit) is provided with a WCBR judgement circuit 7, a super VIH judgement circuit 8 and an address judgement circuit 9. The ext. ZCAS signal, the ext. ZRAS signal and the ext. ZWE signal are inputted into the WCBR judgement circuit 7 through an internal circuit 10. The ext. A1 signal is inputted into the super VIH judgement circuit 8 through another internal circuit 11. The ext. A2 signal and the ext. A3 signal are inputted into the address judgement circuit 9 through a further internal circuit 12, while the reset signal is directly inputted into the address judgement circuit 9.

The WCBR signal is outputted from the WCBR judgement circuit 7, and then it is inputted into the super VIH judgement circuit 8. The SVIH signal is outputted from the super VIH judgement circuit 8, and then it is inputted into the address judgement circuit 9. The TMSELF signal and the TM2 signal are outputted from the address judgement circuit 9. The ext. ZWE signal, the ext. A1 signal, the ext. A2 signal and the ext. A3 signal are all external input signals. On the other hand, the reset signal, the WCBR signal, SVIH signal, the TMSELF signal and the TM2 signal are all internally generated signals.

Figure 4:
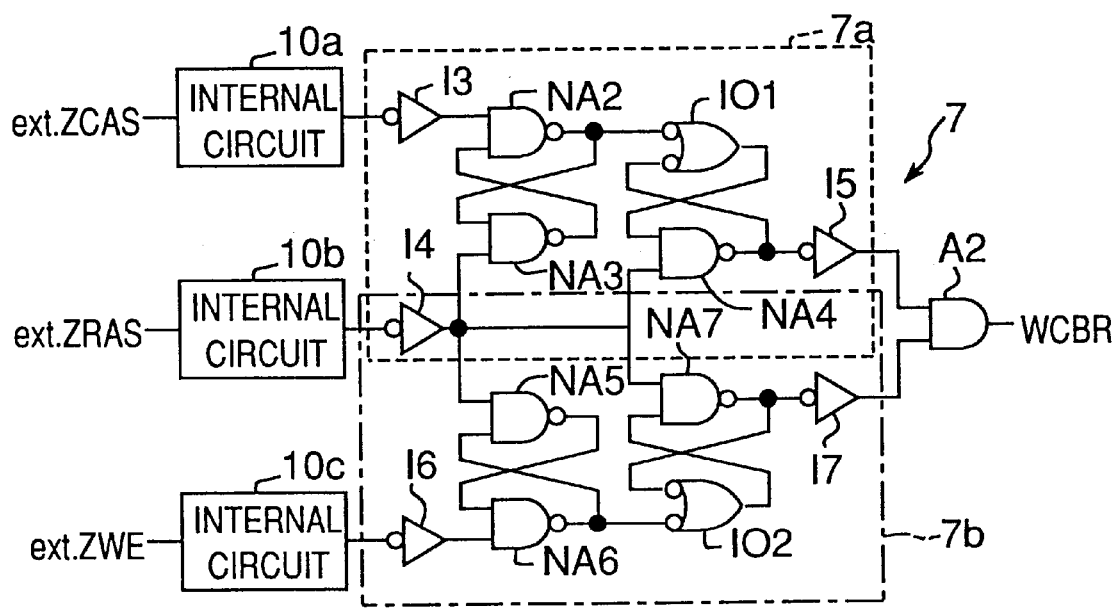
FIG. 4 is a circuit diagram showing the construction of a WCBR judgement circuit of the test mode signal generating circuit shown in FIG. 3.

As shown in FIG. 4, the WCBR judgement circuit 7 is provided with inverters I3–I7, NAND gates NA2–NA7, NAND gates I01 and I02 utilizing OR circuits and an AND gate A2. In the WCBR judgement circuit 7, the internal circuit 10 is divided into partial internal circuits 10a, 10b and 10c corresponding to the respective input-signals of ext. ZCAS, ext. ZRAS and ext. ZWE.

The section, which is surrounded by the broken line 7a in the WCBR judgement circuit 7, outputs the H signal to the AND gate A2 (AND circuit) when the ext. ZRAS signal has fallen (namely, has been activated) later in comparison with the ext. ZCAS signal. On the other hand, the section, which is surrounded by the chain line 7b, outputs the H signal to the AND gate A2 (AND circuit) when the ext. ZRAS signal has fallen later in comparison with the ext. ZWE signal. That is, the WCBR judgement circuit 7 is such a circuit as to cause the internal signal WCBR to become H, when the ext. ZRAS signal has fallen later in comparison with the ext. ZCAS signal and the ext. ZWE signal, namely at the timing point of WCBR.

Figure 5:
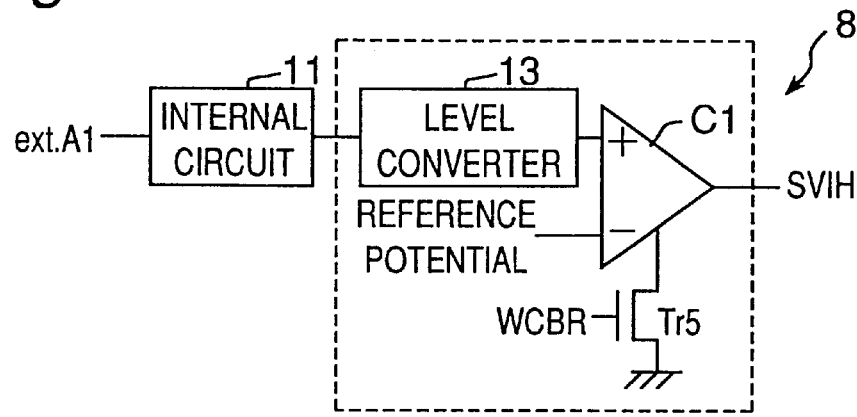
FIG. 5 is a circuit diagram showing the construction of a super VIH judgement circuit of the test mode signal generating circuit shown in FIG. 3.

As shown in FIG. 5, the super VIH judgement circuit 8 is provided with a level converter 13, a comparator C1 and an N-channel MOS transistor TR5 (hereinafter, referred to "Nch-Tr5"). The super VIH judgement circuit 8 receives the WCBR signal outputted from the WCBR judgement circuit 7 so as to be activated. In addition, it causes the SVIH signal to become H, when the ext. A1 signal has a potential higher than the reference potential (standard potential), that is when it has the potential of super VIH level.

Figure 6:
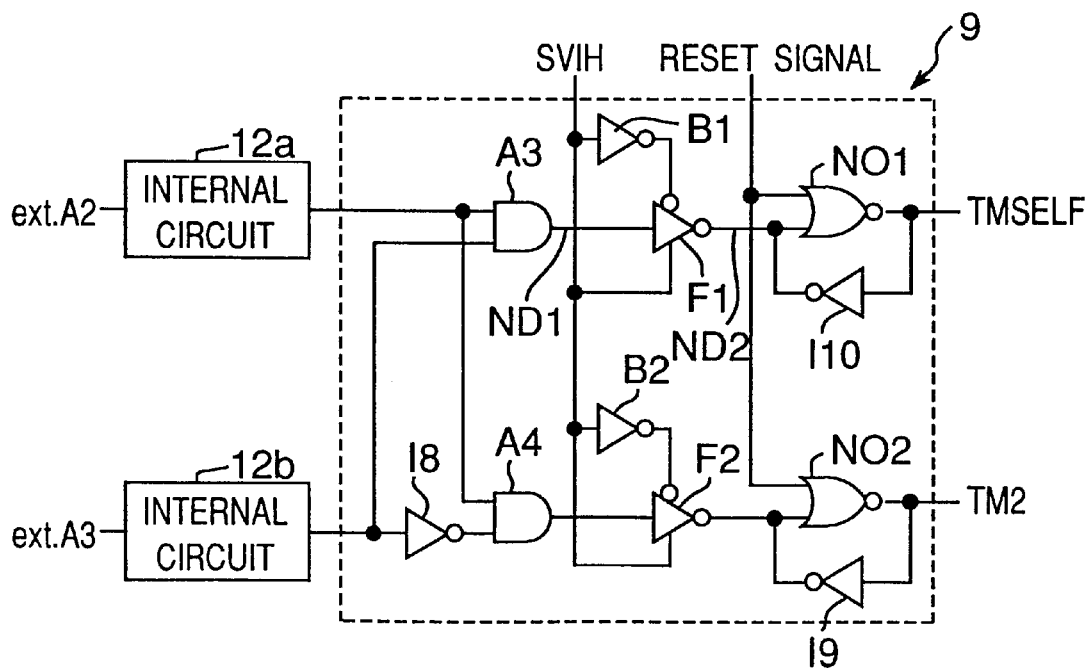
FIG. 6 is a circuit diagram showing the construction of an address judgement circuit of the test mode signal generating circuit shown in FIG. 3.

As shown in FIG. 6, the address judgement circuit 9 is provided with inverters I8–I10, three-state inverters F1 and F2, AND gates A3 and A4, buffer gates B1 and B2 and NOR gates NO1 and NO2. In the address judgement circuit 9, the internal circuit 12 is divided into partial internal circuits 12a and 12b corresponding to the respective input signals of ext. A2 and ext. A3.

The address judgement circuit 9 has such a circuit construction that a latch is provided before the output nodes of the TMSELF signal and the TM2 signal. The address judgement circuit 9 passes the data signal of the node ND1 to the node ND2 (latch) when the SVIH signal has become H, while it does not pass the data signal of the node 1 to the node ND2 when the SVIH signal has become L. The latched data is reset when the reset signal has become H so that the TMSELF signal and the TM2 signal become L The node ND1 becomes H in accordance with combinations of the addresses. The H data signal of the node ND1 is passed to the node ND2 when the SVIH signal is H so that the TMSELF signal becomes H. The reset signal becomes H at the timing of CBR (CAS before RAS) or ROR (RAS only Refresh) so as to reset the latched data.

Thus, the TMSELF signal outputted from the address judgement circuit 9 is inputted into the output circuit 6 (see FIG. 2). As described previously, when the TMSELF signal is H during the self refresh process, the monitoring signal having the wave form as same as that of the int. ZRAS signal or the int. ZRAS signal itself is outputted to the output node DQ of the output circuit 6. On the other hand, when the TMSELF is L, the output circuit 6 receives the ZODH signal and the ZODL signal so as to output the read data of H or L to the output node DQ.

Hereinafter, examples of the actions of the forementioned circuits will be described with reference to the timing chart shown in FIG. 7.

Figure 7:
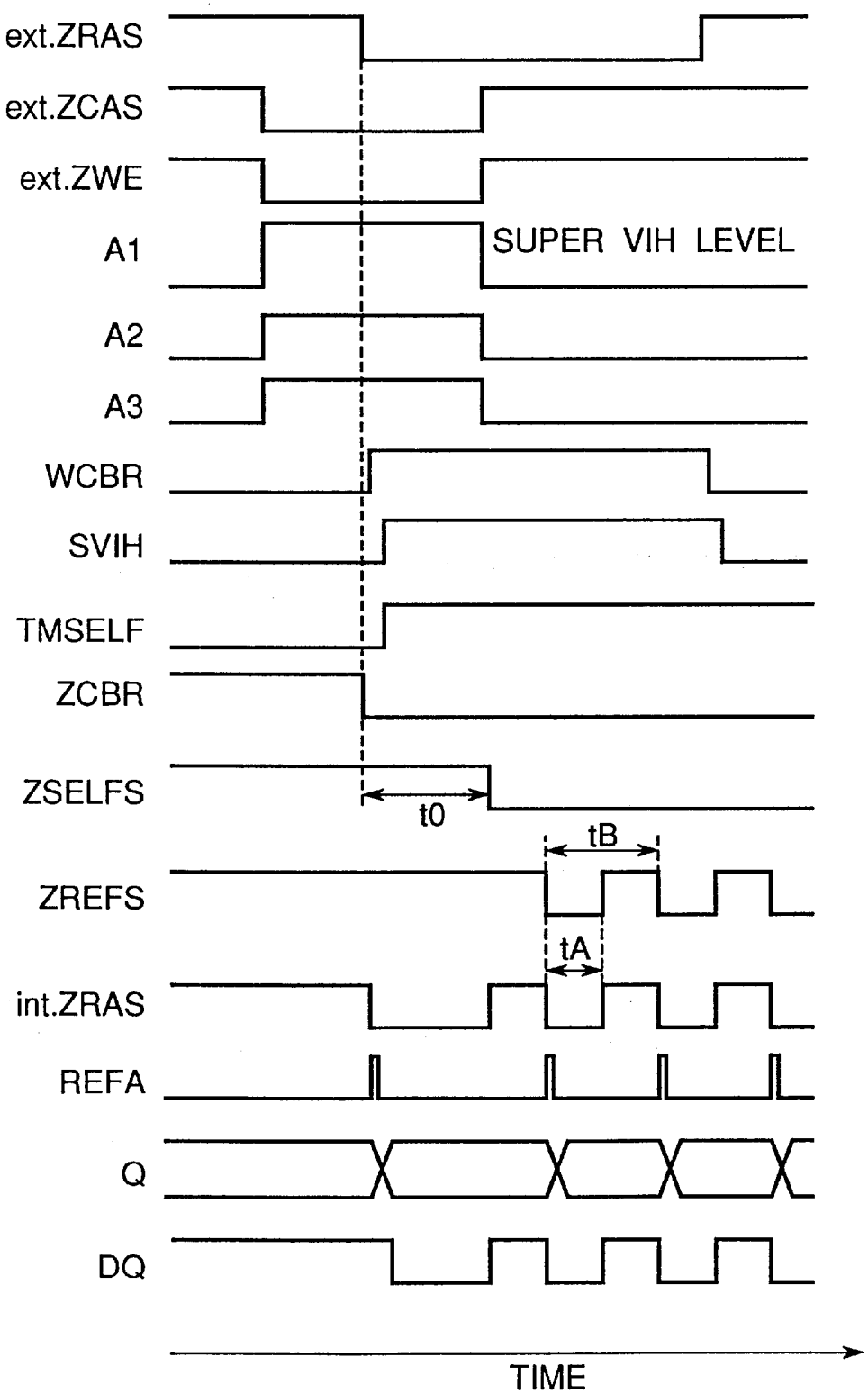
FIG. 7 is a timing chart showing changes of various signals with lapse of time during the self refresh process of the DRAM shown in FIG. 1.

As shown in FIG. 7, when the circuits are not acting at first, the ext. ZRAS signal, the ext. ZCAS signal and the ext. ZWE signal, each of which is one of the external input signals, are all H. After that, when the ext. ZRAS signal has become L later in comparison with the ext. ZCAS signal and the ext. ZWE signal, the WCBR signal outputted from the WCBR judgement circuit 7 becomes H. Because the ext. A1 signal has the potential of super VIH level (potential higher than the reference potential), the SVIH signal outputted from the super VIH judgement circuit 8 becomes H.

Because the ext. A2 signal and the ext. A3 signal are H together, the node ND1 of the address judgement circuit 9 is H. If the SVIH signal has become H as described above in that condition, the data signal of the node ND1 is passed to the node ND2 so that the TMSELF signal outputted from the address judgement circuit 9 becomes H. At that time, the outputted TM2 signal does not change so as to hold L.

When the TMSELF signal and the int. ZRAS signal are H together, the H signal is outputted to the output node DQ because the Pch-Tr2 of the output circuit 6 becomes ON while the Nch-Tr4 becomes OFF. On the other hand, when the TMSELF is H while the int. ZRAS signal is L, the L signal is outputted to the output node DQ because the Pch-Tr2 of the output circuit 6 becomes OFF while the Nch-Tr4 becomes ON. Hereupon, if the reset signal of the address judgement circuit 9 becomes H at the timing of CBR or ROR, the TMSELF signal becomes L. At that time, the Pch-Tr2 and the Nch-Tr4 in the output circuit 6 become OFF together so that high impedance (Hi-Z) is outputted to the output node DQ.

Although the test mode signal generating circuit (TMSELF signal generating circuit) has such a circuit construction as to utilize the timing of WCBR and the control by the address key in the present first embodiment, the circuit construction merely shows an example of the test mode signal generating circuit. Therefore, it is of course that the circuit construction of the test mode signal generating circuit is not limited to that. Any circuit can be used if it can only generate the TMSELF signal as the case of the above-mentioned test mode signal generating circuit.

As described above, in the DRAM according to the first embodiment, the monitoring signal having the wave form as same as that of the int. ZRAS signal or the int. ZRAS signal itself is outputted to the output node DQ (DQ pin) if the TMSELF signal is set to H during the self refresh process. In consequence, by setting the TMSELF signal to H during the self refresh process, the wave form of the int. ZRAS signal for provoking the refresh can be detected at any time so that it can be monitored.

(Second Embodiment)

Hereinafter, the second embodiment of the present invention will be described. However, the fundamental construction of the DRAM according to the second embodiment is common with that of the DRAM according to the first embodiment. Therefore, in order to avoid duplicate descriptions, only the characteristics, which are different from those of the first embodiment, will be described hereinafter.

Figure 8:
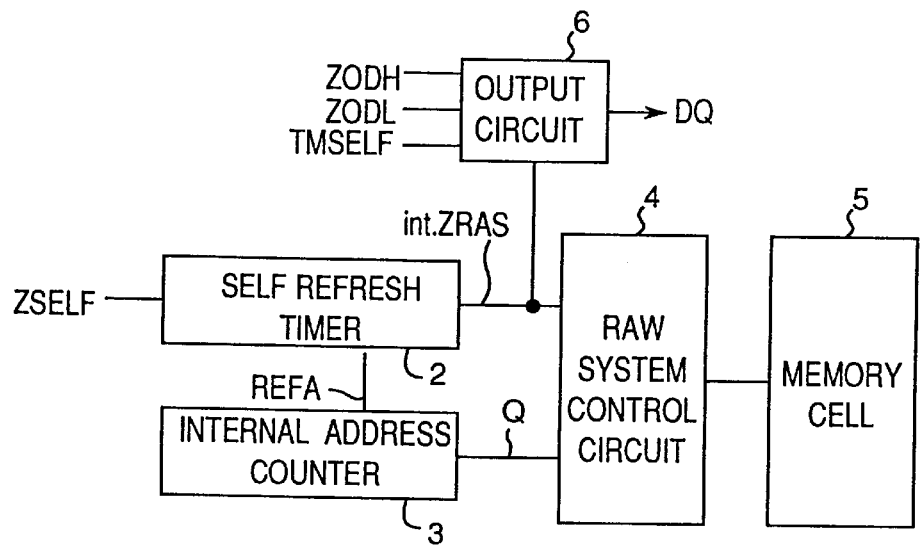
FIG. 8 is a block diagram showing a self refresh circuit of a DRAM according to the second embodiment of the present invention and other circuits relating thereto.

As shown in FIG. 8, the DRAM according to the second embodiment is not provided with the self-in timer 1 of the first embodiment. Therefore, the ZSELF signal, which causes the self-refreshing action to start when it has become L, is inputted into the self refresh timer 2. If the ZCBR signal is used as the ZSELF signal, for example, the self refresh starts when the ext. ZRAS signal has fallen after the ext. ZCAS signal fell. In consequence, time required for performing the self refresh may be shortened.

In the DRAM according to the second embodiment which is not provided with the self-in timer, the monitoring signal having the wave form as same as that of the int. ZRAS signal or the int. ZRAS signal itself is outputted to the output node DQ (DQ pin) as the case of the DRAM according to the first embodiment if the TMSELF signal is set to H during the self refresh process. In consequence, by setting the TMSELF signal to H during the self refresh process, the wave form of the int. ZRAS signal for provoking the refresh can be detected at any time so that it can be monitored.

Although the present invention has been described in relation to particular embodiments thereof, many other variations and modifications will become apparent to those skilled in the art. It is preferred, therefore, that the present invention be limited not by the specific disclosure herein, but only by the appended claims.

What is claimed is:

1. A semiconductor storage device in which each of memory cells is subjected to self refresh on the basis of a specific internal signal for provoking a refreshing action, which comprises:

a refresh monitor circuit appended to an output circuit, which receives a test mode signal of high-level or low-level and then outputs a monitoring signal into a data output pin when said test mode signal is high-level during said self refresh, said monitoring signal having a wave form as same as that of said specific internal signal.

2. The semiconductor storage device according to claim 1, wherein said output circuit includes a P-channel field effect transistor into which a first data signal is inputted through a gate thereof and an N-channel field effect transistor into which a second data signal is inputted through a gate thereof, said output circuit having such a circuit construction that drains of said both field effect transistors are connected to each other, and further a source of said P-channel field effect transistor is connected to a higher voltage section while a source of said N-channel field effect transistor is connected to a lower voltage section; and said refresh monitor circuit includes a P-channel field effect transistor for monitoring use and an N-channel field effect transistor for monitoring use, said P and N channel field effect transistors for monitoring use being connected to said P-channel field effect transistor and said N-channel field effect transistor in parallel, respectively, said semiconductor storage device further comprising:

a logic circuit which receives said test mode signal and said specific internal signal, and then causes each of said field effect transistors for monitoring use to output an output signal to said data output pin when said test mode signal is high-level during said self refresh while causing each of said field effect transistors for monitoring use to become a high impedance state when said test mode signal is low-level, said output signal having a wave form as same as that of said specific internal signal.

3. The semiconductor storage device according to claim 1, further comprising:

a test mode signal generating circuit for generating said test mode signal of high-level or low-level on the basis of an external input signal, said test mode signal being inputted into said refresh monitor circuit.

4. The semiconductor storage device according to claim 2, further comprising:

a test mode signal generating circuit for generating said test mode signal of high-level or low-level on the basis of an external input signal, said test mode signal being inputted into said refresh monitor circuit.

5. The semiconductor storage device according to claim 3, wherein said test mode signal generating circuit causes said test mode signal to become high-level, when a low-active external raw address strobe signal has become low-level later in comparison with a low-active external column address strobe signal and a low-active external write enable signal.

6. The semiconductor storage device according to claim 4, wherein said test mode signal generating circuit causes said test mode signal to become high-level, when a low-active external raw address strobe signal has become low-level later in comparison with a low-active external column address strobe signal and a low-active external write enable signal.

7. The semiconductor storage device according to claim 1, wherein said self refresh is performed when a predetermined time has passed after a low-active external raw address strobe signal became low-level later in comparison with a low-active external column address strobe signal.

8. The semiconductor storage device according to claim 2, wherein said self refresh is performed when a predetermined time has passed after a low-active external raw address strobe signal became low-level later in comparison with a low-active external column address strobe signal.

9. The semiconductor storage device according to claim 3, wherein said self refresh is performed when a predetermined time has passed after a low-active external raw address strobe signal became low-level later in comparison with a low-active external column address strobe signal.

10. The semiconductor storage device according to claim 4, wherein said self refresh is performed when a predetermined time has passed after a low-active external raw address strobe signal became low-level later in comparison with a low-active external column address strobe signal.

11. The semiconductor storage device according to claim 5, wherein said self refresh is performed when a predetermined time has passed after said low-active external raw address strobe signal became low-level later in comparison with said low-active external column address strobe signal.

12. The semiconductor storage device according to claim 6, wherein said self refresh is performed when a predetermined time has passed after said low-active external raw address strobe signal became low-level later in comparison with said low-active external column address strobe signal.

13. The semiconductor storage device according to claim 1, wherein said self refresh is performed when a low-active external raw address strobe signal has became low-level later in comparison with a low-active external column address strobe signal.

14. The semiconductor storage device according to claim 2, where in said self refresh is performed when a low-active external raw address strobe signal has become low-level later in comparison with a low-active external column address strobe signal.

15. The semiconductor storage device according to claim 3, wherein said self refresh is performed when a low-active external raw address strobe signal has become low-level later in comparison with a low-active external column address strobe signal.

16. The semiconductor storage device according to claim 4, wherein said self refresh is performed when a low-active external raw address strobe signal has become low-level later in comparison with a low-active external column address strobe signal.

17. The semiconductor storage device according to claim 5, wherein said self refresh is performed when said low-active external raw address strobe signal has become low-level later in comparison with said low-active external column address strobe signal.

18. The semiconductor storage device according to claim 6, wherein said self refresh is performed when said low-active external raw address strobe signal has become low-level later in comparison with said low-active external column address strobe signal.

* * * * *

UNITED STATES PATENT AND TRADEMARK OFFICE
CERTIFICATE OF CORRECTION

PATENT NO.    : 6,349,066 B1
DATED         : February 19, 2002
INVENTOR(S)   : Yayoi Nakamura It is certified that error appears in the above-identified patent and that said Letters Patent is hereby corrected as shown below:

<u>Title page,</u>
Item [54], change the last word in the title from "CELL" to -- CELLS --;
Item [73], change the third word in the Assignee's name from "Kabuhsiki" to
-- Kabushiki --.

Signed and Sealed this

Fourteenth Day of January, 2003

JAMES E. ROGAN
*Director of the United States Patent and Trademark Office*